United States Patent
Aga et al.

(10) Patent No.: US 8,987,109 B2
(45) Date of Patent: Mar. 24, 2015

(54) METHOD FOR MANUFACTURING BONDED WAFER AND BONDED SOI WAFER

(75) Inventors: Hiroji Aga, Annaka (JP); Isao Yokokawa, Annaka (JP); Nobuhiko Noto, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 14/114,959

(22) PCT Filed: Apr. 25, 2012

(86) PCT No.: PCT/JP2012/002835
§ 371 (c)(1),
(2), (4) Date: Oct. 31, 2013

(87) PCT Pub. No.: WO2012/164822
PCT Pub. Date: Dec. 6, 2012

(65) Prior Publication Data
US 2014/0097523 A1    Apr. 10, 2014

(30) Foreign Application Priority Data
May 30, 2011   (JP) .................. 2011-120340

(51) Int. Cl.
*H01L 21/265*   (2006.01)
*H01L 29/02*   (2006.01)
(Continued)

(52) U.S. Cl.
CPC .......... *H01L 29/02* (2013.01); *H01L 21/26586* (2013.01); *H01L 21/68764* (2013.01);
(Continued)

(58) Field of Classification Search
CPC ................ H01L 21/68764; H01L 21/68771; H01L 21/02038
USPC .......... 438/406, 459, 977; 148/33.3
See application file for complete search history.

(56) References Cited

U.S. PATENT DOCUMENTS 6,372,609 B1 *  4/2002  Aga et al. ............. 438/459
6,458,723 B1 * 10/2002  Henley et al. ......... 438/795
(Continued)

FOREIGN PATENT DOCUMENTS

JP   A-5-211128    8/1993
JP   A-10-125880   5/1998
(Continued)

OTHER PUBLICATIONS

Office Action issued in Japanese Patent Application No. 2011-120340 dated May 13, 2014 (with partial translation).
(Continued)

*Primary Examiner* — George Fourson, III
(74) *Attorney, Agent, or Firm* — Oliff PLC (57) ABSTRACT

A method for manufacturing a bonded wafer includes: an ion implantation step of using a batch type ion implanter; a bonding step of bonding an ion implanted surface of a bond wafer to a surface of a base wafer directly or through an insulator film; and a delamination step of delaminating the bond wafer at an ion implanted layer, thereby manufacturing a bonded wafer having a thin film on the base wafer, wherein the ion implantation into the bond wafer carried out at the ion implantation step is divided into a plurality of processes, the bond wafer is rotated on its own axis a predetermined rotation angle after each ion implantation, and the next ion implantation is carried out at an arrangement position obtained by the rotation.

17 Claims, 5 Drawing Sheets (51) Int. Cl.
*H01L 21/687* (2006.01)
*H01L 21/762* (2006.01)

(52) U.S. Cl.
CPC .... *H01L21/68771* (2013.01); *H01L 21/76254* (2013.01); *H01L 21/265* (2013.01); *Y10S 438/977* (2013.01)
USPC .......................... 438/406; 438/459; 438/977

(56) References Cited

U.S. PATENT DOCUMENTS

| | | | |
|---|---|---|---|
| 6,770,507 B2 * | 8/2004 | Abe et al. .......................... | 438/64 |
| 7,053,386 B1 * | 5/2006 | Holtam et al. ............ | 250/492.21 |
| 7,084,046 B2 * | 8/2006 | Mitani et al. ................... | 438/459 |
| 7,452,757 B2 * | 11/2008 | Werkhoven et al. ........... | 438/149 |
| 7,750,322 B2 * | 7/2010 | Parrill et al. .............. | 250/492.21 |
| 2003/0153162 A1 | 8/2003 | Nakano et al. | |
| 2003/0181001 A1 | 9/2003 | Aga et al. | |
| 2004/0251539 A1 * | 12/2004 | Faris et al. .................... | 257/712 |
| 2005/0118789 A1 | 6/2005 | Aga et al. | |
| 2008/0002244 A1 | 1/2008 | Yagita et al. | |
| 2008/0213974 A1 | 9/2008 | Okuda et al. | |
| 2010/0025597 A1 | 2/2010 | Kasamatsu | |

FOREIGN PATENT DOCUMENTS

| | | |
|---|---|---|
| JP | A-11-307472 | 11/1999 |
| JP | A-2000-124092 | 4/2000 |
| JP | A-2006-324051 | 11/2006 |
| JP | A-2007-242972 | 9/2007 |
| JP | A-2008-182192 | 8/2008 |
| JP | A-2010-129839 | 6/2010 |
| WO | WO 01/93334 A1 | 12/2001 |
| WO | WO 03/009386 A1 | 1/2003 |

OTHER PUBLICATIONS

International Search Report issued in International Patent Application No. PCT/JP2012/002835 dated Jun. 26, 2012.
Office Action issued in Japanese Patent Application No. 2011-120340 dated Oct. 15, 2013 (with partial translation).
Feb. 12, 2014 Office Action issued in Japanese Application No. 2011-120340 (with partial translation).
Oct. 6, 2014 Extended European Search Report issued in European Patent Application No. 12792204.5.
International Preliminary Report on Patentability issued in International Application No. PCT/JP2012/002835 dated Dec. 2, 2013.

* cited by examiner

METHOD FOR MANUFACTURING BONDED WAFER AND BONDED SOI WAFER

TECHNICAL FIELD

The present invention relates to a method for manufacturing a bonded wafer using an ion implantation delamination method, and more particularly to a method for bonding a silicon single crystal wafer having hydrogen ions or the like implanted therein to a base wafer serving as a support substrate and then performing delamination to manufacture a bonded wafer.

BACKGROUND ART

In recent years, as a method for manufacturing a bonded wafer, a method for delaminating an ion-implanted bond wafer after bonding to manufacture a bonded wafer (an ion implantation delamination method: technology that is also called a smart cut method (a registered trademark)) has newly started to attract attention. This ion implantation delamination method is technology that forms an oxide film on at least one of two wafers, implants gas ions such as hydrogen ions or rare gas ions from an upper surface of one wafer (a bond wafer), forms a micro bubble layer (a sealing layer) in the wafer, then adhering the ion-implanted surface to the other wafer (a base wafer) directly or through an oxide film (an insulator film), subsequently performs a heat treatment (a delamination heat treatment), uses the micro bubble layer as a cleaved surface to delaminate one wafer (the bond wafer) in a thin film shape, and further performs a heat treatment (a bonding heat treatment) to strengthen the bonding, thereby manufacturing a bonded wafer having a thin film on the base wafer (see Patent Literature 1). According to this method, the cleaved surface (a delaminated surface) is an excellent mirror surface, and an SOI wafer having a thin film or an SOI layer in particular whose film thickness uniformity is high to some extent is easily obtained.

However, in case of manufacturing the bonded wafer based on the ion implantation delamination method, a damage layer caused due to ion implantation is present on the bonded wafer surface after delamination, and surface roughness is higher than that of a mirror surface of a silicon wafer that is at a regular product level. Therefore, in the ion implantation delamination method, such a damage layer or surface roughness must be removed.

In conventional examples, to remove this damage layer or the like, mirror polishing (a stock removal: approximately 100 nm) with a very small polishing stock removal, which is called touch polish, is carried out at a final step after the bonding heat treatment.

However, when the thin film on the base wafer is subjected to polishing including machine work, since the polishing stock removal is not uniform, there occurs a problem that film thickness uniformity of the thin film achieved to some extent by implantation of hydrogen ions or the like and delamination is deteriorated.

As a method for solving such a problem, a flattening treatment for performing a high-temperature heat treatment in place of the touch polish to improve surface roughness has been carried out.

For example, Patent Literature 2 suggests adding a heat treatment (a rapid heating/rapid cooling heat treatment (RTA)) in a reducing atmosphere containing hydrogen without polishing a surface of an SOI layer after a delamination heat treatment (or after a bonding heat treatment). Further, Patent Literature 3 suggests forming an oxide film on an SOI layer by a heat treatment in an oxidizing atmosphere after a delamination heat treatment (or after a bonding heat treatment), then removing the oxide film, and subsequently adding a heat treatment (the rapid heating/rapid cooling heat treatment (RTA)) in a reducing atmosphere.

Furthermore, in Patent Literature 4, after a flattening heat treatment in an inert gas, a hydrogen gas, or a mixed gas atmosphere containing these gases, a sacrificial oxidation treatment is performed with respect to an SOI wafer after delamination to achieve both flattening of a delamination surface and avoidance of OSF.

Since the flattening treatment for improving surface roughness by carrying out the high-temperature heat treatment in place of touch polish is performed in this manner, each SOI wafer that has a diameter of 300 mm and also has film thickness uniformity that a film thickness range of an SOI layer (a value obtained by subtracting a minimum film thickness value from a maximum film thickness value in a radial direction) is 3 nm or less is mass-produced by the ion implantation delamination method.

CITATION LIST

Patent Literatures

Patent Literature 1: Japanese Patent Application Publication No. H5-211128
Patent Literature 2: Japanese Patent Application Publication No. H11-307472
Patent Literature 3: Japanese Patent Application Publication No. 2000-124092
Patent Literature 4: WO 2003/009386

DISCLOSURE OF INVENTION

With recent spread of portable terminals, reduction in power consumption, miniaturization, and high functionality of semiconductor devices are required, and a fully depleted device using an SOI wafer has been developed as a strong candidate in 22 nm and subsequent generations based on design rules. In this fully depleted device, since a film thickness of an SOI layer affects a threshold voltage, uniformity of a radial film thickness range that is 1 nm or less has been demanded as a radial film thickness distribution of the SOI layer.

Moreover, in recent years, controlling a threshold voltage of a device by applying a bias to a BOX layer (a buried oxide film layer) that is usually used for insulation from a base wafer has been suggested, and a Thin BOX type thin SOI wafer having a reduced BOX layer film thickness must be fabricated.

The present inventors revealed that a radial film thickness range already exceeds 1 nm immediately after delamination as a result of manufacturing a Thin BOX type thin SOI wafer by way of trial and examining transition of a radial film thickness range of an SOI layer in a process. Additionally, as a result of examining a cause of a radial film thickness range immediately after delamination, they also found out that a radial distribution of an implantation depth at the time of ion implantation greatly affects the film thickness radial range after delamination.

As described above, in the method for manufacturing a bonded wafer using the ion implantation delamination method, although a depth (range) distribution of the ion implantation is reflected in the film thickness distribution of the thin film after the delamination as it is, a cone angle effect is known as a cause that produces the depth distribution of the ion implantation.

Figure 2:
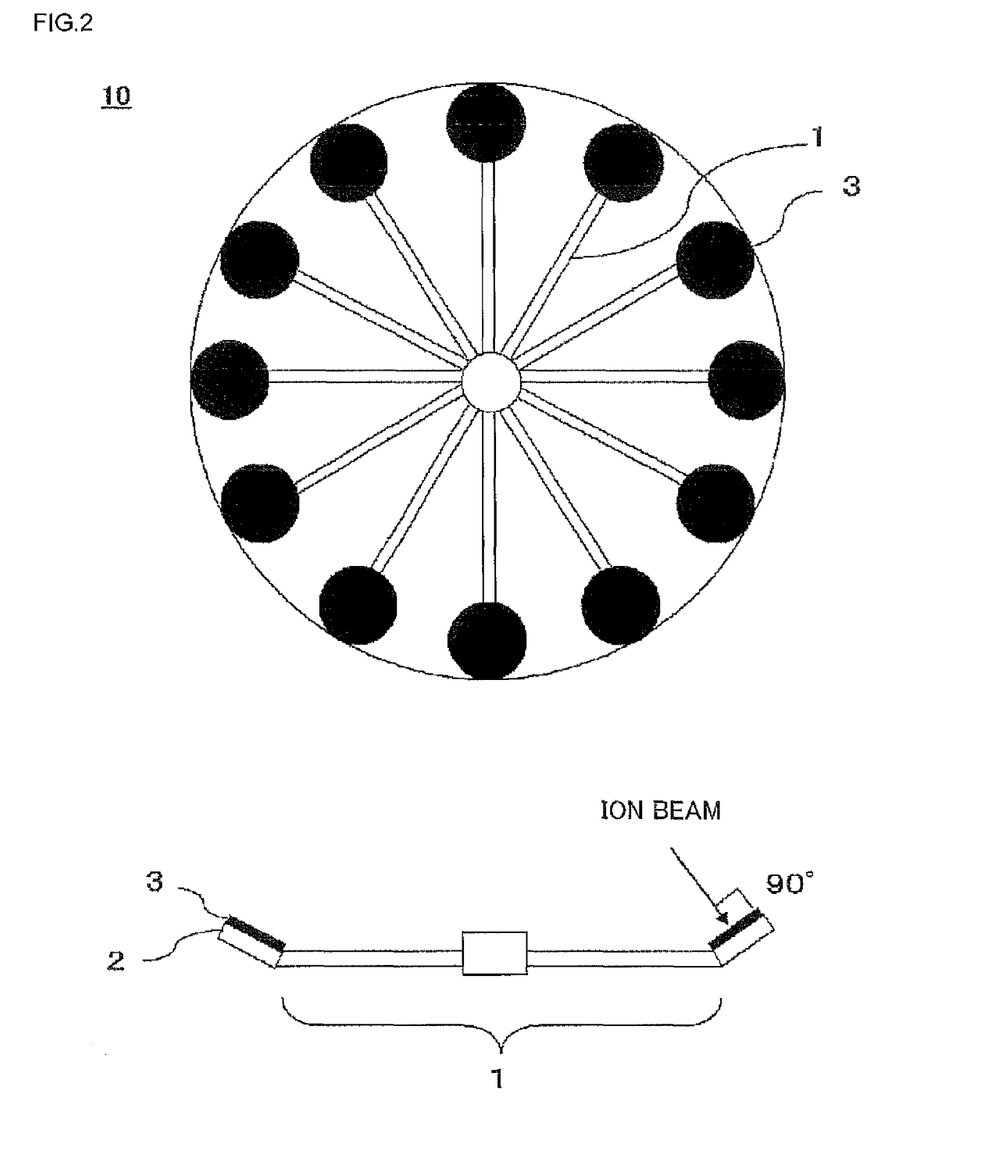
FIG. 2 is a schematic view showing a batch type ion implantation apparatus used in the method for manufacturing a bonded wafer according to the present invention.

Here, as shown in FIG. 2, a batch type ion implanter includes a rotor 1 and a plurality of wafer holders 2 that are provided to the rotor 1 and have substrates 3 arranged thereon. Further, to hold each substrate 3, each wafer holder 2 is slightly inclined toward the inner side from a rotary surface of the rotor 1.

Figure 3:
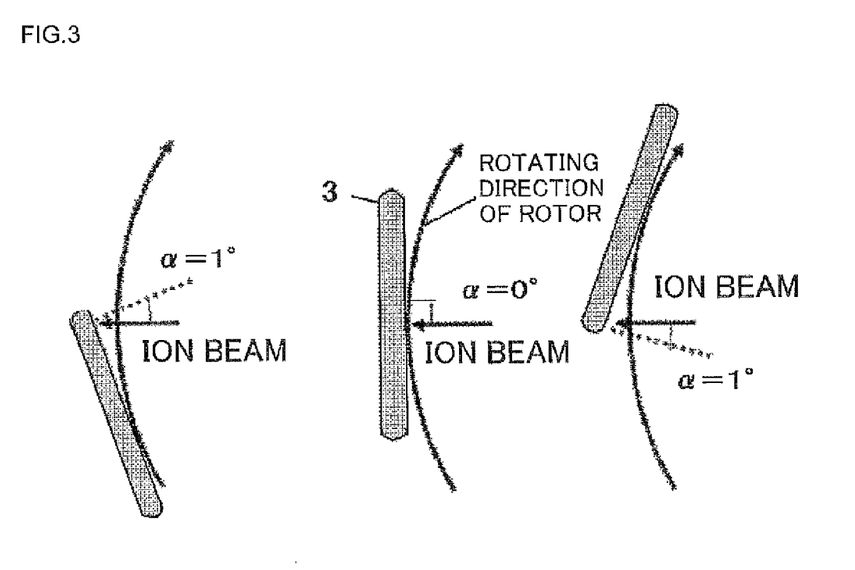
FIG. 3 is an explanatory view for explaining a cone angle effect.

As a result, when the rotor 1 is rotating, force that presses each substrate 3 against each wafer holder 2 functions due to centrifugal force, and the wafer holder 2 holds the substrate 3. However, when the rotary surface of the rotor 1 is not parallel to a surface of each substrate 3 in this manner, even if implanting an ion beam to the substrate 3 at a fixed angle is tried, a small displacement occurs in an implant angle at a center portion of the substrate and both end portions of the substrate in a beam scan direction in accordance with rotation of the rotor, whereby an ion implantation depth becomes deep at the center portion of the substrate and it becomes shallow at both end portions of the substrate in the scan direction (FIG. 3). This is called the cone angle effect. Therefore, in ion implantation based on the ion implantation delamination method, as shown in FIG. 3, when a set angle between the substrate 3 and the ion beam is set to an implant angle 0 degree ($\alpha=0°$) at which an angle between the substrate surface and the ion beam forms a right angle, the implant angle can be substantially equally displaced at both end portions of the substrate in the scan direction, thereby a radial distribution of the implantation depth becomes relatively uniform.

However, when the batch type ion implanter is used, there can be considered a second cause that produces unevenness of radial depth distribution of the ion implantation even though the implant angle is set to 0 degree.

The second cause that produces the film thickness distribution is occurrence of channeling in fabrication of a Thin BOX type SOI wafer or a directly bonded wafer that does not use an oxide film. In fabrication of the directly bonded wafer using no oxide film or the Thin BOX type SOI wafer having a BOX layer (a silicon oxide film layer) film thickness of 100 nm or less, a scattering effect of the oxide film become deteriorated, and channeling occurs in the ion implantation at an implant angle of 0 degree. In case of the bath type ion implanter, since an angle between a crystal plane and an ion beam forms a right angle at the central portion of the substrate, the effect of channeling increases, and the ion implantation depth becomes large. On the other hand, at both ends of the substrate in the scan direction, since an implant angle is produced due to a cone angle, an influence of channeling becomes relatively lessened, and an ion implantation depth becomes small (see FIG. 6). As described above, in fabrication of the Thin BOX type SOI wafer or the directly bonded wafer using no oxide film, the effect of the cone angle is emphasized by the channeling in particular.

To avoid the channeling, a method for inclining an implant angle relative to a crystal plane and effecting implantation is generally known, but the effect of a cone angle differs depending on each of both ends of the substrate in a scan direction when the implant angle is inclined, and hence a radial depth distribution becomes large. Further, although a method for avoiding channeling by using a wafer (a wafer with an OFF angle) having an inclined crystal axis orientation of the wafer itself is known, since an implant angle differs depending on each of both end portions in a scan direction like the method for inclining the implant angle, and hence a radial depth distribution becomes large.

In view of the above-described problem, it is an object of the present invention to provide a method for manufacturing a bonded wafer, the method enabling manufacturing the bonded wafer having improved film thickness uniformity of a thin film on a base wafer, which is especially an SOI layer, at a mass-production level.

Means for Solving Problem

To achieve the object, according to the present invention, there is provided a method for manufacturing a bonded wafer comprising: an ion implantation step of ion-implanting at least any one kind of gas ions selected from hydrogen ions and rare gas ions from a surface of a bond wafer to form an ion implanted layer by using a batch type ion implanter, the ion implanter comprising a rotor and a plurality of wafer holders that are provided to the rotor and have substrates arranged thereon and implanting ions into the plurality of substrates that are arranged on the wafer holders and revolve; a bonding step of bonding the ion implanted surface of the bond wafer to a surface of a base wafer directly or through an insulator film; and a delamination step of delaminating the bond wafer at the ion implanted layer, thereby manufacturing a bonded wafer having a thin film on the base wafer, wherein the ion implantation into the bond wafer carried out at the ion implantation step is divided into a plurality of processes, the bond wafer arranged on each wafer holder is rotated on its own axis a predetermined rotation angle after each ion implantation, and the next ion implantation is carried out at an arrangement position obtained by the rotation.

According to the method for manufacturing a bonded wafer of the present invention, the ion implantation into the bond wafer by using a batch type ion implanter carried out at the ion implantation step is divided into a plurality of processes, the bond wafer arranged on each wafer holder is rotated on its own axis a predetermined rotation angle after each ion implantation, and the next ion implantation is carried out at an arrangement position obtained by the rotation, the bond wafer can be thereby set up on the wafer holder in the direction that differs depending on each ion implantation, and avoiding the ion implantation at an overlapping arrangement position enables improving unevenness of the ion implantation depth distribution, thus finally manufacturing the bonded wafer having the dramatically improved film thickness uniformity of the thin film at the mass production level.

Furthermore, at this time, it is preferable to divide the ion implantation into two processes and carry out, rotate the bond wafer on its axis 90 degrees or 180 degrees after the first ion implantation, and carry out the second ion implantation at an arrangement position obtained by the rotation.

When the ion implantation is performed in this way, unevenness of the ion implantation depth distribution can be reduced, the ion implantation depth distribution becomes close to a concentric distribution in which the ion implantation depth distribution is relatively deep at a bond wafer central portion and it is shallow on an entire circumference at a bond wafer outer peripheral portion, and hence a film thickness distribution can be easily corrected by a subsequent thinning step based on oxidation or polishing included in the bonded wafer manufacturing process.

Furthermore, after the first ion implantation, when the bond wafer is rotated on its axis 180 degrees and the second ion implantation is carried out at an arrangement position obtained by the rotation, an influence of a displacement of the crystal axis can be canceled out even though the crystal axis orientation of the bond wafer to be used is displaced due to, e.g., an influence of a processing accuracy, and the bonded wafer having the dramatically improved film thickness uniformity of the thin film can be eventually manufactured at the mass-production level.

Moreover, it is preferable to divide the ion implantation into four processes and carry out, and perform the second and subsequent ion implantation at an arrangement position obtained by rotating each wafer on its axis any rotation angle selected from 90 degrees, 180 degrees, and 270 degrees with respect to the first ion implantation.

When the ion implantation is divided into four processes and carried out in this way, the unevenness can be further reduced and the ion implantation depth distribution becomes further close to the concentric distribution as compared with the case where the ion implantation is divided into two processes and carried out, thereby further facilitating correction of the film thickness distribution based on a treatment, e.g., oxidation.

Additionally, it is preferable to set an angle between a crystal plane of a surface of the bond wafer and a direction of the ion implantation to a right angle and carry out each ion implantation.

When the angle formed between the crystal plane of the surface of the bond wafer and the ion implantation direction is set to a right angle, that is, when the ion implant angle is set to 0 degree, the unevenness of the film thickness distribution of the thin film after the delamination can be further suppressed, which is preferable.

Further, it is preferable to use a silicon single crystal wafer as the bond wafer and also use a silicon oxide film of 100 nm or less as the insulator film.

According to the present invention, even in case of manufacturing a Thin BOX type thin SOI wafer having a silicon oxide film of 100 nm or less that excellent film thickness uniformity is hard to be obtained in the conventional examples, it is possible to manufacture the thin SOI wafer having the radial film thickness range of 1 nm or less and the very excellent film thickness uniformity.

Furthermore, it is preferable to adjust a film thickness of the thin film by performing a sacrificial oxidation treatment with respect to the thin film, by use of an oxidation furnace for carrying out the sacrificial oxidation treatment with respect to the thin film on the base wafer, the oxidation furnace enabling providing a concentric oxide film thickness distribution formed by the sacrificial oxidation and making an oxide film thickness on the outer peripheral side thinner.

When the sacrificial oxidation treatment is carried out with respect to the thin film on the base wafer after the delamination step by using the oxidation furnace that provides the concentric shape to the oxide film thickness distribution to be formed and makes the oxide film thickness on the outer peripheral side thinner, the further film thickness adjustment of the thin film can be carried out, and the bonded wafer having the further improved film thickness range as compared with that immediately after delamination can be obtained.

It is conventionally difficult to obtain the excellent film thickness uniformity of the Thin BOX type thin SOI wafer having the silicon oxide film of 100 nm or less. However, when the method for manufacturing a bonded wafer according to the present invention is used, there is provided a bonded SOI wafer in which a buried oxide film layer and an SOI layer are sequentially formed on a surface of a base wafer, wherein a film thickness of the buried oxide film layer is 100 nm or less, and a radial film thickness range of the SOI layer is 1 nm or less.

Effect of Invention

As described above, according to the method for manufacturing a bonded wafer of the present invention, the unevenness of the ion implantation depth distribution can be improved, the bonded wafer having the dramatically improved film thickness uniformity can be eventually manufactured at the mass-production level, a threshold voltage of a device using such a bonded wafer can be thereby stabilized, and a device yield rate can be improved.

DESCRIPTION OF EMBODIMENTS

The present inventors found out that unevenness of a film thickness distribution of a thin film which is especially an SOI film on a base wafer caused due to a cone angle effect can be suppressed by dividing the ion implantation into the bond wafer carried out at the ion implantation step into a plurality of processes, rotating the bond wafer on its own axis a predetermined rotation angle after each ion implantation, and performing the subsequent ion implantation at an arrangement position obtained by the rotation to avoid the ion implantation at an overlapping arrangement position, and they brought the present invention to completion. The present invention will now be explained hereinafter in detail.

Figure 1:
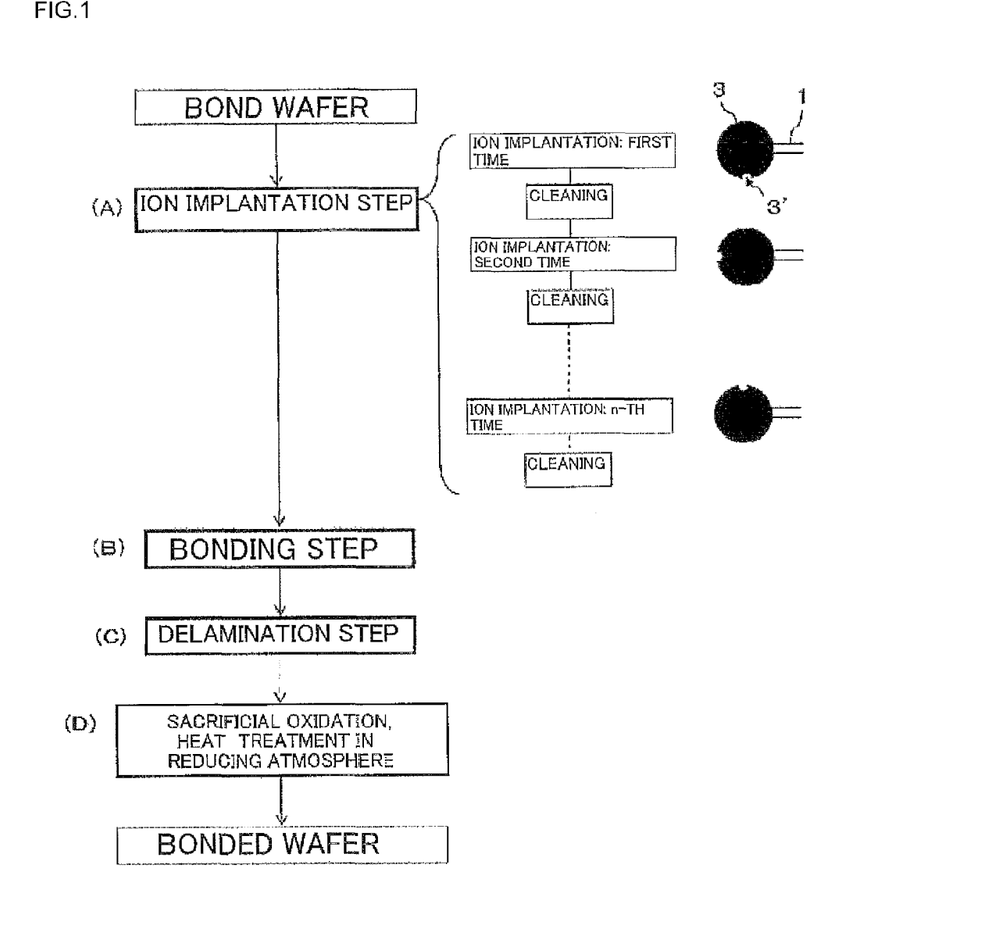
FIG. 1 is a process flowchart showing an example of a method for manufacturing a bonded wafer according to the present invention.

FIG. 1 is a process flowchart showing an example of a method for manufacturing a bonded wafer according to the present invention.

The present invention provides a method for manufacturing a bonded wafer comprising: an ion implantation step (FIG. 1(A)) of ion-implanting at least any one kind of gas ions selected from hydrogen ions and rare gas ions from a surface of a bond wafer to form an ion implanted layer by using a batch type ion implanter, the ion implanter comprising a rotor and a plurality of wafer holders that are provided to the rotor and have substrates arranged thereon and implanting ions into the plurality of substrates that are arranged on the wafer holders and revolve; a bonding step (FIG. 1(B)) of bonding the ion implanted surface of the bond wafer to a surface of a base wafer directly or through an insulator film; and a delamination step (FIG. 1(C)) of delaminating the bond wafer at the ion implanted layer, thereby manufacturing a bonded wafer having a thin film on the base wafer, wherein the ion implantation into the bond wafer carried out at the ion implantation step is divided into a plurality of processes, the bond wafer arranged on each wafer holder is rotated on its own axis a predetermined rotation angle after each ion implantation, and the next ion implantation is carried out at an arrangement position obtained by the rotation.

First, as shown in FIG. 1(A), at least any one kind of gas ions selected from hydrogen ions and rare gas ions are ion-implanted from a surface of a bond wafer to form an ion implanted layer. It is to be noted that hydrogen molecular ions are also included in the "hydrogen ions" in the present invention.

Here, the bond wafer into which ions are implanted can be arbitrarily selected in accordance with a purpose, and it is not restricted in particular, but using, e.g., a silicon single-crystal wafer enables manufacturing an SOI wafer having an SOI layer with a very uniform film thickness.

Further, it is preferable to previously form an insulator film on the surface of the bond wafer before the ion implantation. As described above, in the conventional method for manufacturing a Thin BOX type thin SOI wafer, a cone angle effect is emphasized by channeling, on the other hand, in the present invention, even when a silicon single crystal wafer with a diameter of 300 mm or above, which tends to take the cone angle effect prominently, is used as the bond wafer, and even when a silicon oxide film of 100 nm or less or 50 nm or less is adopted as the insulator film, a Thin BOX type thin SOI wafer having excellent film thickness uniformity can be manufactured.

The ion implantation in the method for manufacturing a bonded wafer according to the present invention uses a batch type ion implanter shown in the schematic view of FIG. 2. The batch type ion implanter 10 includes a rotor 1 and a plurality of wafer holders 2 that are provided on the rotor 1 and has substrates 3 arranged thereon, and ions are implanted into the plurality of substrates 3 that are arranged on the wafer holders 2 and revolve.

In the method for manufacturing a bonded wafer according to the present invention, as shown in FIG. 1(A), the ion implantation into the bond wafer 3 carried out at the ion implantation step is divided into a plurality of processes, each bond wafer 3 arranged on each wafer holder 2 is rotated on its own axis a predetermined rotation angle after each ion implantation, and the subsequent ion implantation is carried out at an arrangement position obtained by the rotation. It is to be noted that FIG. 1(A) shows an example of performing ion implantation divided into n processes (n≥2), which is a case where each bond wafer 3 is rotated on its own axis 90° after the first ion implantation (a notch 3' position is moved 90°) and second ion implantation is carried out at this arrangement position obtained by the rotation.

In case of performing the ion implantation only once, a dyad symmetry ion implantation depth distribution is obtained because of an ion implantation depth distribution produced between a wafer center portion and both end portions of the wafer in an implantation ion beam scan direction by the cone angle effect.

Like the present invention, for example, when the ion implantation is divided into two processes and carried out, and each wafer is rotated 90 degrees between respective processes of ion implantation, an ion implantation depth is relatively deep at the bond wafer central portion and shallow on an entire circumference at a bond wafer outer peripheral portion, and a uniform distribution is obtained and becomes closer to a concentric distribution. On the other hand, a thinning step based on oxidation or polishing is performed while rotating the wafer, and hence an oxide film thickness distribution or a polishing stock removal becomes a concentric distribution. Therefore, unevenness of a film thickness distribution caused due to the ion implantation is improved, and the film thickness distribution is turned to a concentric distribution, therefore the film thickness distribution can be easily corrected by a treatment such as oxidation performed during a bonded wafer manufacturing process, and hence the film thickness distribution of the eventually obtained thin film can be improved.

Moreover, when the number of processes of the ion implantation is not restricted to two, the ion implantation is divided into four processes, and the second and subsequent ion implantation are performed at an arrangement position obtained by rotating each wafer on its axis any rotation angle selected from 90 degrees, 180 degrees, and 270 degrees with respect to the first ion implantation, the more complete concentric distribution can be obtained as compared with the case where the implantation is performed in two processes. Therefore, the correction of the film thickness distribution by a treatment such as oxidation can be further facilitated.

When a crystal axis orientation of the bond wafer to be used is slightly displaced due to, e.g., an influence of a processing accuracy, an angle is actually formed between a crystal axis and an ion beam even though implantation is performed with an implant angle being set to 0 degree with respect to a wafer surface. In this case, since the dyad symmetry distribution in the scan direction collapses, a concentric depth distribution cannot be obtained by the implantation divided into two processes according to circumstances. In this case, when a wafer direction in the implantation divided into two processes is set to 180 degrees, the displacement of the crystal axis can be canceled out, the concentric distribution can be thereby obtained, and a bonded wafer having improved film thickness uniformity of a thin film can be eventually manufactured at a mass-production level.

Additionally, in this case, when an angle that cancels out the displacement of the crystal axis is set to the implant angle of the ion beam, an influence of the displacement of the crystal axis can be further suppressed. That is, setting an angle between a crystal plane of a surface of the bond wafer and a direction of the ion implantation to a right angle (setting the ion implant angle relative to the crystal plane to 0 degree) enables further suppressing unevenness of the film thickness distribution of the thin film after a delamination step, which is preferable.

Additionally, as shown in FIG. 1(A), it is preferable to clean the bond wafer after each ion implantation. When the bond wafer cleaning step is performed between the respective processes of the ion implantation, particles adhering to the ion-implanted surface can be removed, thus eliminating a failure of the ion implantation.

Further, as shown in FIG. 1(B), the ion implanted surface of the bond wafer is bonded to a surface of a base wafer directly or through an insulator film.

As the base wafer, a silicon single crystal wafer can be used, but it is not restricted in particular. Usually, when surfaces of the bond wafer and the base wafer are brought into contact with each other in a clean atmosphere at a normal temperature, the wafers are bonded to each other without using an adhesive or the like.

Subsequently, as shown in FIG. 1(C), the bond wafer is delaminated at the ion implanted layer, whereby the bonded wafer having a thin film on the base wafer is fabricated.

For example, when a heat treatment that is performed in an inert gas atmosphere at a temperature of approximately 500° C. or more is added, the bond wafer can be delaminated at the ion implanted layer. Further, when a plasma treatment is performed with respect to a bonded surface at a normal temperature in advance, delamination can be carried out by applying external force without adding a heat treatment (or after adding a heat treatment that does not cause delamination).

The thin film immediately after such a delamination step (FIG. 1(C)) has a large diameter of 300 mm or 450 mm, even the Thin BOX type having an insulator film of 100 nm or less has an improved film thickness distribution whose film thickness range is 1 nm or less, the film thickness distribution becomes close to a concentric shape in particular, and the film thickness distribution can be easily corrected by subsequent thinning based on oxidation or polishing.

Further, thereafter, as shown in FIG. 1(D), to achieve improvement in bond strength, adjustment of a film thickness of the thin film, and flattening the thin film surface, it is preferable to perform a sacrificial oxidation treatment (thermal oxidation+removal of the oxide film) and a heat treatment in a reducing atmosphere or an inert gas atmosphere and thereby manufacture the bonded wafer. As these processing conditions, any condition that has been generally carried out in the conventional examples can be adopted.

It is to be noted that, when an oxidation furnace that enables providing a concentric oxide film thickness distribution formed by the sacrificial oxidation and making an oxide film thickness on the outer peripheral side thinner is used as the oxide furnace where the oxidation treatment is carried out, the film thickness range is further improved as compared with that immediately after delamination, and the bonded wafer having the excellent film thickness uniformity can be manufactured. As such an oxidation furnace, using an oxidation furnace which is of a type that oxidation is carried out while rotating the wafer on an axis provided at the center of the wafer is preferable.

It is to be noted that, when a stock removal distribution of the thin film deviates from the concentric shape at each step after the delamination step (e.g., a sacrificial oxidation treatment or a reducing atmosphere heat treatment), an implant angle at each ion implantation can be finely adjusted so that the film thickness distribution of a final film thickness can be improved.

EXAMPLES

Although the present invention will now be explained in more detail hereinafter based on examples and a comparative example of the present invention, these examples do not restrict the present invention.

Example 1

A thermal oxide film that can function as a BOX layer (a buried oxide film layer) of 25 nm was formed on a bond wafer (a crystal plane on a surface is precisely (100), and there is no angle deviation) made of silicon single crystal with a diameter of 300 mm and a crystal orientation of <100>, and then hydrogen ions were implanted with use of such a batch type ion implanter as shown in FIG. 2.

The hydrogen ion implantation was divided into two processes and carried out, ions were implanted under conditions of $H^+$, 30 keV, $2.6e16$ $cm^{-2}$, an implant angle of 0 degree, and a notch orientation angle of 0 degree as the first ion implantation, and ions were implanted under conditions of $H^+$, 30 keV, $2.6e16$ $cm^{-2}$, an implant angle of 0 degree, and a notch orientation angle of 90 degrees as second ion implantation.

It is to be noted that the notch orientation angle means an angle obtained by rotating a notch position of the wafer from a standard position (0 degree) in a clockwise direction at the time of arranging the bond wafer on a wafer holder of an ion implanter.

After the hydrogen ion implantation, the bond wafer was bonded to a base wafer made of silicon single crystal, and it was delaminated at a hydrogen ion implanted layer by a nitrogen atmosphere heat treatment conducted at 500° C. for 30 minutes. Then, to improve bond strength, adjust a film thickness of an SOI layer, and flatten a surface of the SOI layer under conditions shown in Table 1, a sacrificial oxidation treatment (thermal oxidation+removal of the oxide film) and a heat treatment in a reducing atmosphere were carried out, thereby manufacturing a thin-film SOI wafer.

It is to be noted that a vertical thermal oxidation furnace where the oxidation treatment was carried out is of a type that the oxidation treatment is performed while rotating a wafer boat that holds a wafer, a radial distribution of a thermal oxide film thickness to be formed is very excellent, and its distribution shape is a concentric shape and has a tendency that an oxide film thickness on a wafer outer peripheral side is thinner.

A film thickness range of the manufactured SOI layer was measured twice, i.e., timing immediately after delamination and timing after end of the sacrificial oxidation treatment and the reducing atmosphere heat treatment (after thinning) by using Acumap manufactured by ADE Corporation.

Figure 4:
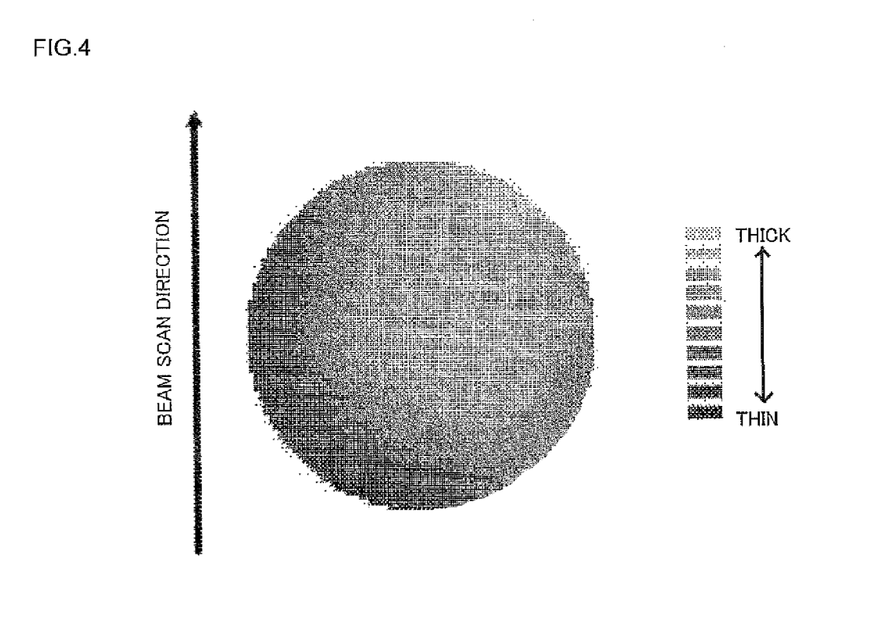
FIG. 4 is an SOI layer film thickness distribution immediately after delamination in Example 1.

Table 1 shows manufacturing conditions of the manufactured SOI wafer and a result of measuring the film thickness range (immediately after delamination, after thinning) of the SOI layer. Furthermore, FIG. 4 shows an SOI film thickness distribution immediately after delamination.

It is to be noted that, as to the film thickness range of the SOI layer, the same result was obtained by any other measurement apparatus (e.g., ASET-F5x manufactured by Tencor) using an ellipsometry or reflection spectroscopy.

Example 2

An SOI wafer was manufactured by the same method as Example 1 except an ion implantation step.

Figure 5:
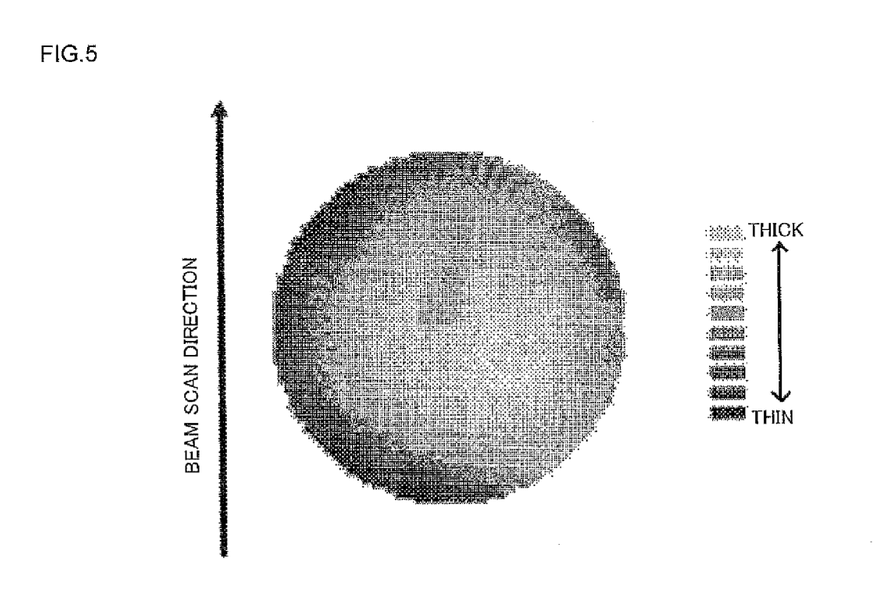
FIG. 5 is an SOI layer film thickness distribution immediately after delamination in Example 2.

The hydrogen ion implantation was divided into four processes and carried out, ions were implanted under conditions of $H^+$, 30 keV, $1.3e16$ $cm^{-2}$, an implant angle of 0 degree, and a notch orientation angle of 0 degree as the first ion implantation; ions were implanted under conditions of $H^+$, 30 keV, $1.3e16$ $cm^{-2}$, an implant angle of 0 degree, and a notch orientation angle of 90 degrees as second ion implantation; ions were implanted under conditions of $H^+$, 30 keV, $1.3e16$ $cm^{-2}$, an implant angle of 0 degree, and a notch orientation angle of 180 degree as third ion implantation; and ions were implanted under conditions of $H^+$, 30 keV, $1.3e16$ $cm^{-2}$, an implant angle of 0 degree, and a notch orientation angle of 270 degrees as fourth ion implantation. Table 1 shows manufacturing conditions of the manufactured SOI wafer and a result of measuring a film thickness range (immediately after delamination, after thinning) of an SOI layer. Furthermore, FIG. 5 shows an SOI film thickness distribution immediately after delamination.

Comparative Example

An SOI wafer was manufactured by the same method as Example 1 except an ion implantation step.

Figure 6:
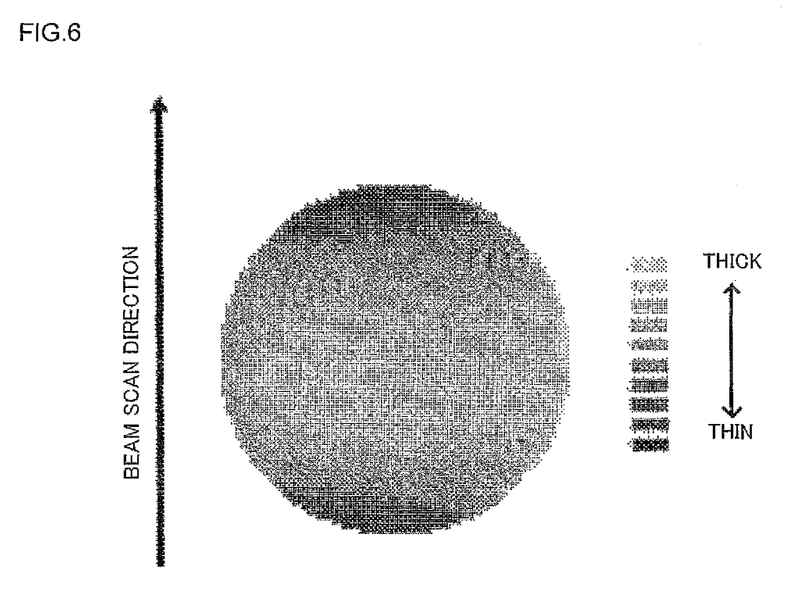
FIG. 6 is an SOI layer film thickness distribution immediately after delamination in Comparative Example.

The hydrogen ion implantation was carried out once, and ions were implanted under conditions of $H^+$, 30 keV, $5.2e16$ $cm^{-2}$, an implant angle of 0 degree, and a notch orientation angle of 0 degree. Table 1 shows manufacturing conditions of the manufactured SOI wafer and a result of measuring a film thickness range (immediately after delamination, after thinning) of an SOI layer. Furthermore, FIG. 6 shows an SOI film thickness distribution immediately after delamination.

TABLE 1

|  | Example 1 | Example 2 | Comparative Example |
|---|---|---|---|
| Bond wafer | Diameter 300 mm, <100>, Surface oxide film 25 nm | | |
| Base wafer | Diameter 300 mm, <100>, No surface oxide film, | | |
| Ion implantation | Twice | Four times | Once |
| 1st ion implantation conditions | $H^+$, 30 keV, $2.6e16$ cm$^{-2}$, Implant angle 0 degree, Notch orientation angle 0 degree | $H^+$, 30 keV, $1.3e16$ cm$^{-2}$, Implant angle 0 degree, Notch orientation angle 0 degree | $H^+$, 30 keV, $5.2e16$ cm$^{-2}$, Implantation angle 0 degree, Notch orientation angle 0 degree |
| 2nd ion implantation conditions | $H^+$, 30 keV, $2.6e16$ cm$^{-2}$, Implant angle 0 degree, Notch orientation angle 90 degrees | $H^+$, 30 keV, $1.3e16$ cm$^{-2}$, Implant angle 0 degree, Notch orientation angle 90 degrees | None |
| 3rd ion implantation conditions | None | $H^+$, 30 keV, $1.3e16$ cm$^{-2}$, Implant angle 0 degree, Notch orientation angle 180 degrees | None |
| 4th ion implantation conditions | None | $H^+$, 30 keV, $1.3e16$ cm$^{-2}$, Implant angle 0 degree, Notch orientation angle 270 degrees | None |
| Delamination heat treatment | 500° C., 30 minutes, Nitrogen atmosphere | | |
| SOI film thickness immediately after delamination | 330 nm | 330 nm | 330 nm |
| SOI film thickness distribution immediately after delamination | Range: 0.9 nm (FIG. 4) | Range: 0.8 nm (FIG. 5) | Range: 1.2 nm (FIG. 6) |
| Oxidation conditions (with boat rotation) | 950° C., Pyro-oxidation, Oxide film thickness 720 nm | 950° C., Pyro-oxidation, Oxide film thickness 720 nm | 950° C., Pyro-oxidation, Oxide film thickness 720 nm |
| Reducing heat treatment | $H_2$, 1200° C., 1 hr | $H_2$, 1200° C., 1 hr | $H_2$, 1200° C., 1 hr |
| SOI film thickness after thinning | 12 nm | 12 nm | 12 nm |
| SOI film thickness distribution after thinning | Range: 0.6 nm | Range: 0.5 nm | Range: 1.2 nm |

As shown in Table 1, as the film thickness range of the SOI layer immediately after delamination, a value smaller than 1 nm, which is an objective, was obtained in both of Examples 1 and 2. Furthermore, as its distribution shape, a shape close to a concentric shape was obtained. On the other hand, in case of Comparative Example, the film thickness range of the SOI layer immediately after delamination exceeded 1 nm, and its distribution shape was a dyad symmetry shape.

Moreover, the film thickness range after end of the sacrificial oxidation treatment and the reducing atmosphere heat treatment in each of Examples 1 and 2 was further improved as compared with that immediately after delamination. It can be considered that this improvement was realized owing to an effect obtained by performing the sacrificial oxidation with use of the oxidation furnace that enables providing the concentric oxide film thickness distribution to be formed and making the oxide film thickness on the wafer outer peripheral side thinner.

As described above, although the bonded SOI wafer manufactured in each of Examples 1 and 2 is of a Thin BOX type that has a diameter of 300 mm and a BOX layer of 25 nm, the radial film thickness range of the SOI layer is 1 nm or less immediately after delamination, 1 nm or less is maintained even after the treatment that realizes improvement of bond strength, adjustment of the film thickness of the SOI layer, and flattening of a surface of the SOI layer, and the bonded SOI wafer having the very excellent radial film thickness range, which cannot be obtained by conventional manufacturing methods, was acquired.

It is to be noted that the present invention is not restricted to the foregoing embodiment. The foregoing embodiment is just an illustrative example, and any example that has substantially the same configuration and exercises the same functions and effects as the technical concept described in claims is included in the technical scope of the present invention.

The invention claimed is:

1. A method for manufacturing a bonded wafer comprising: an ion implantation step of ion-implanting at least any one kind of gas ions selected from hydrogen ions and rare gas ions from a surface of a bond wafer to form an ion implanted layer by using a batch type ion implanter, the ion implanter comprising a rotor and a plurality of wafer holders that are provided to the rotor and have substrates arranged thereon and implanting ions into the plurality of substrates that are arranged on the wafer holders and revolve; a bonding step of bonding the ion implanted surface of the bond wafer to a surface of a base wafer directly or through an insulator film; and a delamination step of delaminating the bond wafer at the ion implanted layer, thereby manufacturing a bonded wafer having a thin film on the base wafer,
wherein the ion implantation into the bond wafer carried out at the ion implantation step is divided into a plurality of processes, the bond wafer arranged on each wafer holder is rotated on its own axis a predetermined rotation angle after each ion implantation, and the next ion implantation is carried out at an arrangement position obtained by the rotation.

2. The method for manufacturing a bonded wafer according to claim 1,
wherein the ion implantation is divided into two processes and carried out, the bond wafer is rotated on its axis 90 degrees or 180 degrees after the first ion implantation, and the second ion implantation is carried out at an arrangement position obtained by the rotation.

3. The method for manufacturing a bonded wafer according to claim 1,
wherein the ion implantation is divided into four processes and carried out, and the second and subsequent ion implantation are carried out at an arrangement position obtained by rotating each wafer on its axis any rotation angle selected from 90 degrees, 180 degrees, and 270 degrees with respect to the first ion implantation.

4. The method for manufacturing a bonded wafer according to claim 1,
wherein an angle between a crystal plane of a surface of the bond wafer and a direction of the ion implantation is set to a right angle, and each ion implantation is carried out.

5. The method for manufacturing a bonded wafer according to claim 2,
wherein an angle between a crystal plane of a surface of the bond wafer and a direction of the ion implantation is set to a right angle, and each ion implantation is carried out.

6. The method for manufacturing a bonded wafer according to claim 3,
wherein an angle between a crystal plane of a surface of the bond wafer and a direction of the ion implantation is set to a right angle, and each ion implantation is carried out.

7. The method for manufacturing a bonded wafer according to claim 1,
wherein a silicon single crystal wafer is used as the bond wafer, and a silicon oxide film of 100 nm or less is used as the insulator film.

8. The method for manufacturing a bonded wafer according to claim 2,
wherein a silicon single crystal wafer is used as the bond wafer, and a silicon oxide film of 100 nm or less is used as the insulator film.

9. The method for manufacturing a bonded wafer according to claim 3,
wherein a silicon single crystal wafer is used as the bond wafer, and a silicon oxide film of 100 nm or less is used as the insulator film.

10. The method for manufacturing a bonded wafer according to claim 4,
wherein a silicon single crystal wafer is used as the bond wafer, and a silicon oxide film of 100 nm or less is used as the insulator film.

11. The method for manufacturing a bonded wafer according to claim 5,
wherein a silicon single crystal wafer is used as the bond wafer, and a silicon oxide film of 100 nm or less is used as the insulator film.

12. The method for manufacturing a bonded wafer according to claim 6,
wherein a silicon single crystal wafer is used as the bond wafer, and a silicon oxide film of 100 nm or less is used as the insulator film.

13. The method for manufacturing a bonded wafer according to claim 1,
wherein a film thickness of the thin film is adjusted by performing a sacrificial oxidation treatment with respect to the thin film, by use of an oxidation furnace for carrying out the sacrificial oxidation treatment with respect to the thin film on the base wafer, the oxidation furnace enabling providing a concentric oxide film thickness distribution formed by the sacrificial oxidation and making an oxide film thickness on the outer peripheral side thinner.

14. The method for manufacturing a bonded wafer according to claim 2,
wherein a film thickness of the thin film is adjusted by performing a sacrificial oxidation treatment with respect to the thin film, by use of an oxidation furnace for carrying out the sacrificial oxidation treatment with respect to the thin film on the base wafer, the oxidation furnace enabling providing a concentric oxide film thickness distribution formed by the sacrificial oxidation and making an oxide film thickness on the outer peripheral side thinner.

15. The method for manufacturing a bonded wafer according to claim 3,
wherein a film thickness of the thin film is adjusted by performing a sacrificial oxidation treatment with respect to the thin film, by use of an oxidation furnace for carrying out the sacrificial oxidation treatment with respect to the thin film on the base wafer, the oxidation furnace enabling providing a concentric oxide film thickness distribution formed by the sacrificial oxidation and making an oxide film thickness on the outer peripheral side thinner.

16. The method for manufacturing a bonded wafer according to claim 4,
wherein a film thickness of the thin film is adjusted by performing a sacrificial oxidation treatment with respect to the thin film, by use of an oxidation furnace for carrying out the sacrificial oxidation treatment with respect to the thin film on the base wafer, the oxidation furnace enabling providing a concentric oxide film thickness distribution formed by the sacrificial oxidation and making an oxide film thickness on the outer peripheral side thinner.

17. The method for manufacturing a bonded wafer according to claim 7,
wherein a film thickness of the thin film is adjusted by performing a sacrificial oxidation treatment with respect to the thin film, by use of an oxidation furnace for carrying out the sacrificial oxidation treatment with respect to the thin film on the base wafer, the oxidation furnace enabling providing a concentric oxide film thickness distribution formed by the sacrificial oxidation and making an oxide film thickness on the outer peripheral side thinner.

* * * * *